United States Patent [19]
Le Van Suu

[11] Patent Number: 6,014,021
[45] Date of Patent: Jan. 11, 2000

[54] ELECTRICITY METER USING FUZZY LOGIC CIRCUIT

[75] Inventor: Maurice G. Le Van Suu, Romainville, France

[73] Assignee: SGS-Thomson Microelectronics S.A., Gentilly, France

[21] Appl. No.: 08/735,441

[22] Filed: Jan. 2, 1997

[30] Foreign Application Priority Data

Feb. 1, 1996 [FR] France ................................. 96 01449

[51] Int. Cl.⁷ ............................................... G01R 21/06
[52] U.S. Cl. ............................................. 324/142; 324/74
[58] Field of Search ............................... 324/103 R, 142, 324/141, 74; 702/60, 61, 85, 183, 59, 3; 700/291, 293

[56] References Cited

U.S. PATENT DOCUMENTS

| | | | |
|---|---|---|---|
| 4,686,460 | 8/1987 | Stevens et al. | 324/142 |
| 5,212,441 | 5/1993 | McEachern et al. | 324/142 |
| 5,319,300 | 6/1994 | Wood | 324/142 |
| 5,357,449 | 10/1994 | Oh | 364/551.01 |
| 5,400,330 | 3/1995 | Le Van Suu | 370/84 |
| 5,406,248 | 4/1995 | Le Van Suu | 340/310.01 |
| 5,511,044 | 4/1996 | Dubost et al. | 324/183 |
| 5,537,248 | 7/1996 | Le Van Suu | 395/309 |

FOREIGN PATENT DOCUMENTS

0446962A2   4/1987   European Pat. Off. .

OTHER PUBLICATIONS parallel–FUCS: Einsatzsystem zur On–line— und Real-time–Fuzzy–Klassifikation, by: Holger Frank, Chemnitz, 1994 (unavailable month).

SGS–Thomson Microelectronics, S.A. Technical Manual, "Adaptive Fuzzy Modeler, AFM 1.0," Mar. 1996, pp. 1–4.

SGS–Thomson Microelectronics, S.A. Application Note, "Fuzzy Prgrammable Board W.A.R.P. 2.0 General Purpose Application Board,"pp. 1–20, (unavailable date).

SGS–Thomson Microelectronics, S.A. Technical Manual, "Fuzzy Studio TM 2.0," Mar. 1996, pp. 1–8.

SGS–Thomson Microelectronics, S.A. Appendix, "Appendix A—Fuzzy Logic Introduction. Human Language and Indeterminacy," Mar. 1996, pp. A1–A22.

J. Josserand et al., "Fuzzy Component Network for Intelligent Measurement and Control," IEEE Transactions on Fuzzy Systems, vol. 4, No. 4, Nov. 1996, pp. 476–487.

Primary Examiner—Vinh P. Nguyen
Attorney, Agent, or Firm—Allen, Dyer, Doppelt, Milbrath & Gilchrist, P.A.

[57] ABSTRACT

An electricity meter includes a first current probe, a first voltage probe and a display unit memorizing its contents. This meter comprises a fuzzy logic processor having a fuzzy logic decision-making computer with a non-volatile memory available to store membership functions corresponding to the first voltage and current probes and to store decision rules. The computer takes a decision, according to the rules, that is weighted by the membership functions and is aimed at incrementing the contents of the display unit. This meter has the particular feature, among others, by which it can be recalibrated on site.

18 Claims, 2 Drawing Sheets

ELECTRICITY METER USING FUZZY LOGIC CIRCUIT

BACKGROUND OF THE INVENTION

1. Field of the Invention

The invention relates to an electricity meter for accurately determining the consumption of a given electrical installation.

2. Description of the Prior Art

There are two known types of electricity meters, electromechanical and electronic. Electromechanical meters use a small motor that rotates at a speed which depends on the power consumed. The small motor drives a mechanical counter that stores the values of total power consumed. The mechanical losses due to friction make the system insensitive to low current, below 70 mA. This results in a failure to sense and store power values of below 15.4 W. The calibration of these electromechanical meters is relatively lengthy and the meter cannot be recalibrated after it has suffered a certain amount of wear and tear. Furthermore, the mechanical parts are relatively costly.

Electronic meters are designed to eliminate certain defects of electromechanical meters. Thus, electronic meters have a lower limit of sensitivity. They cost less to manufacture. A meter can be recalibrated following a drift in the performance of its components. Nevertheless, the calibration operations take a great deal of time (for the setting of the potentiometers) and a machine cannot be recalibrated at the place of its use.

There also exist fuzzy logic processors and the concept of fuzzy logic in the prior art, for taking decisions on the basis of input parameters that have low linearity or no linearity and can assume several values for a zone of a curve in a given operation.

SUMMARY OF THE INVENTION

The invention is aimed at obtaining an electronic meter designed to reduce the calibration time and capable of being recalibrated on site by means of a learning stage. The learning stage matches the behavior of the system to the variation and/or the drift undergone by the input variables. The meter according to the invention uses fuzzy logic to perform the measurement and to correct possible errors in measurement. Furthermore, the meter can be recalibrated on site.

Thus, an object of the invention is an electrical meter comprising a current probe, a voltage probe and a display unit storing its contents, wherein the meter further comprises a fuzzy logic processor with a decision-making computer working by fuzzy logic and possessing a non-volatile memory to store membership functions corresponding to the first voltage and current probes, and to store decision rules. The computer takes a decision according to the rules that are weighted by the membership functions and is aimed at incrementing the contents of the display unit.

The use of fuzzy logic enables the calibration of the machine to be accelerated by a learning method. Furthermore, the fuzzy logic processor enables the processing of operations that are more complex in regard to billing than is the case with standard meters. The fuzzy logic meter furthermore can decode messages coming from carrier current modulation from the power line.

The single-phase meter can very easily be transposed into a three-phase meter.

Furthermore, a meter of this kind may be recalibrated on site by the connection of a reference apparatus that measures the same power as the meter and sends the meter an information element on any drift in power value which the meter will subsequently add to each power measurement.

BRIEF DESCRIPTION OF THE DRAWINGS

The invention will be understood more clearly and other features and advantages shall appear from the following description of an exemplary embodiment of the invention, given by way of an indication that in no way restricts the scope of the invention and with reference to the appended drawings, of which.

DETAILED DESCRIPTION OF THE PREFERRED EMBODIMENTS

Figure 1:
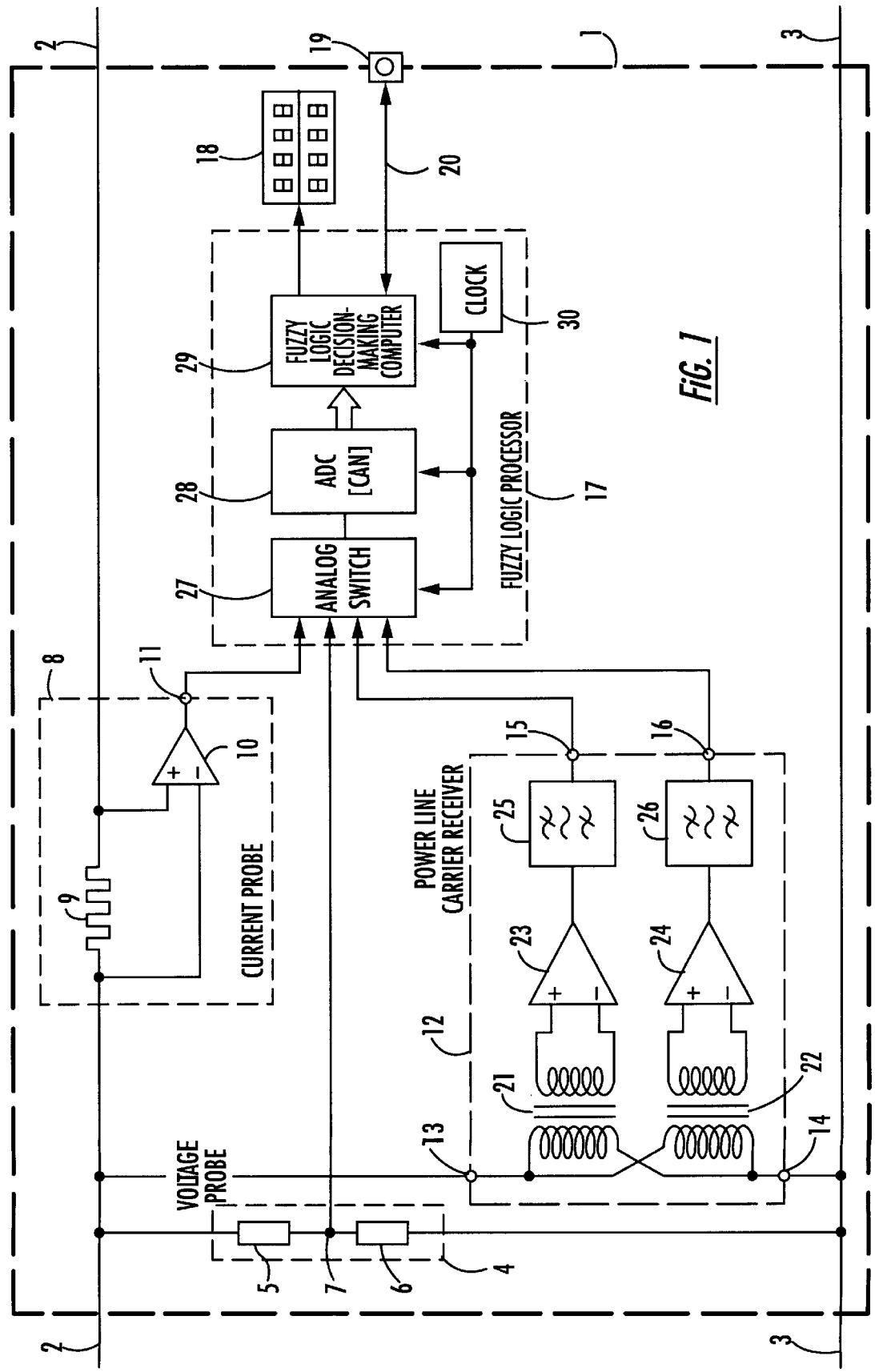
FIG. 1 is a schematic block diagram of a meter according to the invention.

The meter 1 shown in FIG. 1 is connected to two electrical wires 2 and 3 conveying the mains supply, the wire 2 being connected to the phase and the wire 3 being connected to the neutral line. The meter 1 further includes:

- a voltage probe 4 formed by a voltage divider bridge consisting of two resistors 5 and 6, the resistor 5 having one of its terminals connected to the phase 2 and the other terminal connected to an output terminal 7 of the voltage probe 4, the resistor 6 having one of its terminals connected to the neutral line 3 and the other of its terminals connected to the output terminal 7 of the voltage probe 4,

- a current probe 8 formed by a shunt resistor 9 inserted in the wire 2 conveying the phase and a differential amplifier 10 having two inputs and one output, each of the two inputs of the amplifier 10 being connected to one of the terminals of the shunt register 9 and the output of the amplifier 10 being connected to the output terminal 11 of the current probe 8,

- a circuit 12 for the recovery of signals in carrier current form, this circuit 12 having two input terminals 13 and 14 and two output terminals 15 and 16, the input terminal 13 being connected to the phase 2 and the input terminal 14 being connected to the neutral line 3,

- a fuzzy logic processor 17 having four analog signal inputs, one information output and one communications input/output, the first signal input being connected to the terminal 11 of the current probe 8, the second signal input being connected to the terminal 7 of the voltage probe 4, the third and fourth signal inputs being connected respectively to the terminals 15 and 16 of the circuit 12,

- a display and storage system 18 having one input connected to the information output of the processor 17, and

- a connector 19 connected to the communications input/output of the processor 17 by means of a bus 20.

It would be appropriate for access to the connector 19 to be reserved to authorized staff, for example through the use of a cover with a lead seal.

The shunt resistor 9 does not need to be very precise. It is possible for example to use a resistor with a precision of 10% and to make it directly on a piece of metal.

The embodiments of the voltage probe 4 and of the current probe 8 have been chosen for their simplicity. A range of probes with varying degrees of precision may be substituted for those chosen here. Certain modifications designed to adapt other probes to the circuit would be readily understood by those skilled in the art.

The circuit 12 is illustratively formed by two transformers 21 and 22 each having a primary winding and a secondary winding. The primary winding of the two transformers 21 and 22 are parallel-connected between the terminals 13 and 14. The secondary winding of each transformer 21 and 22 is connected to the inputs of differential amplifiers 23 and 24. The output of each of the amplifiers 23 and 24 is connected to the input of a passband filter 25 and 26 respectively. The passband filter 25 has cutoff frequencies of 175 Hz and 188 Hz for example. The passband filter 26 has a center frequency of 60 kHz for example. The 175 Hz and 188 Hz frequencies correspond to the bandwidth of the message indicating the change between the full or peak-hour tariff and the off-peak tariff in France and the 60 kHz frequency is a frequency used to transmit messages by carrier current. The transformer 21 used to recover the signal at 175 Hz and 188 Hz may be the same transformer as the one used to supply the meter 1. The other transformer 22 will be of the type that is resonant (possibly provided with capacitors) at the 60 kHz frequency, and in this case the passband filter 26 may be replaced by a lowpass filter whose output will deliver the demodulated signal.

The fuzzy logic processor 17 comprises:

a four-input analog switch 27 for one output having selection inputs, an analog/digital converter 28 that converts an analog data element into a digital data element preferably encoded on 16 bits (12 signed bits is the minimum required), the converter comprising one analog input, one digital output on 16 bits and one synchronization input, a fuzzy logic decision computer 29, this component possibly being, for example, a component marketed by the firm SGS THOMSON MICROELECTRONICS S.A. under the generic name W.A.R.P., a component of this kind having available a non-volatile memory and internal registers with a 16-bit architecture and having one digital output, one serial input/output, one digital input and synchronization inputs.

The switch 27 has its analog inputs, which are the analog inputs of the fuzzy logic processor 17, and its analog output connected to the analog input of the converter 28. The output of the converter 28 is connected to the digital input of the computer 29. The serial input/output of the computer 29 is the communications input/output of the fuzzy logic processor 17. A clock synchronization circuit 30 sends signals to the selection input of the switch 27 as well as to the synchronization inputs of the converter 28 and the computer 29. These signals are used for the sampling and digital conversion of the different input signals.

The display system 18 is herein formed by two display units (off-peak tariff and full tariff). Furthermore, the display system is provided with two electronic counters whose power supply is backed up by a battery. Depending on the signal sent to the input, neither of the two counters will do any counting or else one of them will be incremented by one unit. The display system 18 is also used as a storage unit.

Certain parts have been deliberately left out or simplified in order to clarify the functional aspect of the diagram. Thus, the power supply of the different elements of the meter is not shown. Nor does the drawing show certain connections that are needed to convey synchronization signals. The communications input/output is actually formed by several wires and corresponds to a standard series type communication. The current probe is connected to the phase wire 2. This may require the addition of protection means for the amplifier 10. These protection means are not shown.

Those skilled in the art may use certain elements to replace other known and functionally equivalent assemblies. The following explanations will have to be adapted to these modifications, if any.

The measurement of the consumed power corresponds to the value of the integral of the instantaneous power. To obtain this integral, the Riemans method is used. This method consists in taking the sum of the instantaneous power values at three very short periods of time, for example periods equal to 1 ms. The operation of taking the sum therefore gives a result expressed, for example, in W.ms. This result is stored in registers of the fuzzy logic processor 17 (for example two 16-bit words). Whenever the accumulated result exceeds 1 kW.H, namely 3,600,000 W.ms, one of the counters of the display unit is incremented by one unit according to the prevailing tariff. The fact of using one and the same variable for the off-peak tariff and the full or peak-hour tariff may appear to be wrong. Those skilled in the art are therefore free to use either one variable or two variables (either two 16-bit words or four 16-bit words). With regard to the exemplary embodiment of FIG. 1, it has been chosen to use only one variable in the processor. Indeed, the error amounts to less than one kW.H and occurs, in principle, as much to the advantage of one party as to that of the other (the customer or the supplier).

The innovation provided by the fuzzy logic processor 17 arises essentially out of the operation of the computer 29. Indeed, the computer 29 processes the input variables by means of membership functions and rules generating decisions weighted by the membership functions.

Figure 2A:
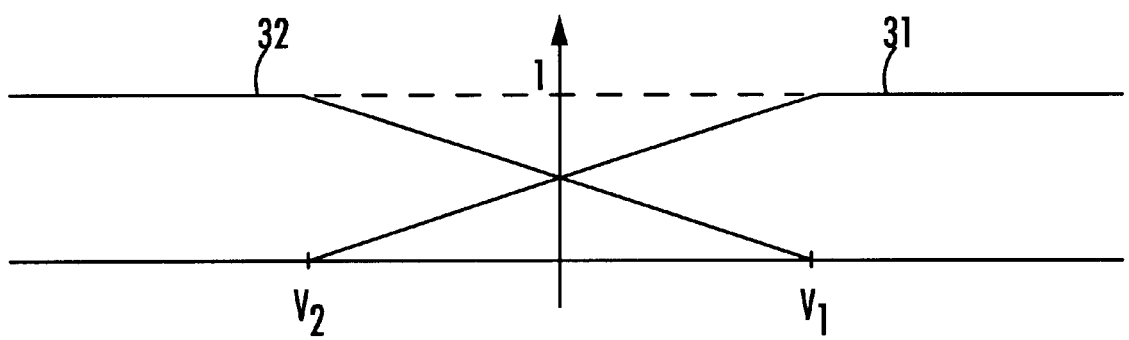
FIGS. 2a and 2b are graphs of membership functions that can be used in the meter shown in FIG. 1.
Figure 2B:
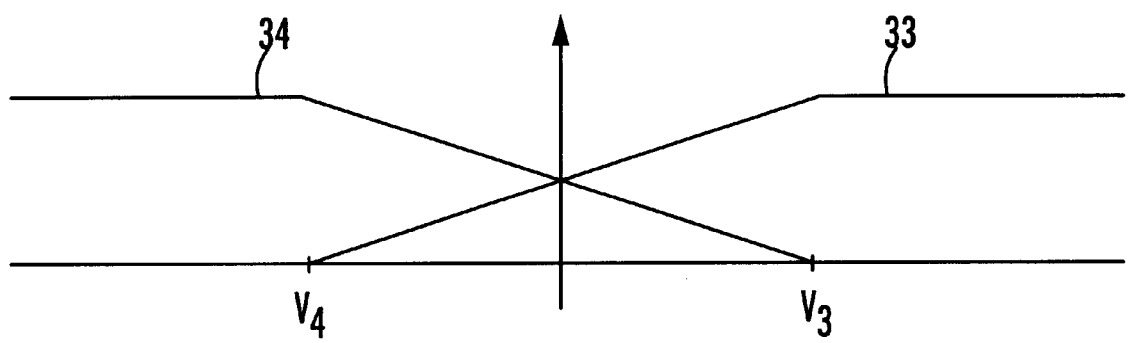

The membership functions may, in one example, be highly simplified because the current probe 8 and voltage probe 4 are typically linear. It goes without saying that, if these probes are not linear, the membership functions will be more numerous. The membership functions pertaining to the current probe 8 and voltage probe 4 are presented respectively in FIGS. 2a and 2b.

The membership function 31 is equal to 1 for voltages above a threshold voltage V1 and 0 for voltages below a threshold voltage V2, and increases linearly from 0 to 1 for voltages ranging respectively from V2 to V1. The membership function 32 is equal to 1 for voltages below a threshold voltage V1 and 0 for voltages above a threshold voltage V2, and decreases linearly from 0 to 1 for voltages ranging respectively from V2 to V1. The membership function 33 is equal to 1 for voltages above a threshold voltage V3 and 0 for voltages below a threshold voltage V4, and increases linearly from 0 to 1 for voltages ranging respectively from V4 to V3. The membership function 34 is equal to 1 for voltages below a threshold voltage V3 and 0 for voltages above a threshold voltage V4, and decreases linearly from 0 to 1 for voltages ranging respectively from V4 to V3.

The threshold voltages V1, V2, V3 and V4 represent a given current or voltage. These thresholds V1 to V4 are recorded in the non-volatile memory of the computer 29 during a learning stage. This means that, during the learning stage, the probes 4 and 8 of the meter 1 are connected to a measuring stand and then a maximum voltage is imposed on the voltage probe 4, giving the threshold value V3. Then the operation is started again with a minimum voltage to have the threshold V4. Thus, the 11 resistors 5 and 6 do not need to have great precision for, during this learning operation, the fuzzy logic processor rectifies any variations in the values of these resistors 5 and 6. A similar operation is performed on the current probe 8 in order to obtain the thresholds V1 and V2. It is noted that here too the precision of the resistor is of little importance (it is therefore possible to use a copper track) and that it is not necessary to use a complicated and costly differential amplifier to compensate for possible offset (this is a well known phenomenon that adds some millivolts to the output of the amplifier). It will have been noted that since the probes 4 and 8 do not need very great precision for the values of the tolerances, the cost of these probe 4 and 8 is reduced.

In practice, the minimum voltage that can be measured by the meter is equal in terms of absolute voltage to the maximum voltage that can be measured by this meter. Only the sign of these voltages is opposite. This is also the case for the minimum measurable current and the maximum measurable current. If the maximum measurable instantaneous power is called Pmax, this power being equal to the maximum measurable current multiplied by the maximum measurable voltage, then the following rules may be used:

- if the current belongs to the function 31 and the voltage belongs to the function 33, then the measured power is Pmax,
- if the current belongs to the function 32 and the voltage belongs to the function 33, then the measured power is -Pmax,
- if the current belongs to the function 31 and the voltage belongs to the function 34, then the measured current is -Pmax,
- if the current belongs to the function 32 and the voltage belongs to the function 34, then the measured power is Pmax.

These rules are then made use of in a weighted way as a function of the membership of the measurements in the different measurement functions 31 to 34, the weighted sum of these rules giving the power measurement decision. In other words, the functions of membership 31 to 34 will fix the weighting coefficients depending on the real values measured.

As a numerical example, the following are a few values for an apartment meter working at 220 V r.m.s. and 30 A r.m.s.:

maximum instantaneous voltage=350 V, minimum instantaneous voltage=−350 V, maximum instantaneous current 45 A, minimum instantaneous current=−45 A, instantaneous Pmax=15,750 W, real threshold V1=4.8 V, real threshold V2=−4.7 V, real threshold V3=4.5 V, real threshold V4=−4.5 V.

If a measurement is made of the power consumed in a load causing a phase shift of π/6 and consuming 1A at 220 V by sampling the current and the voltage every millisecond:

- the first measurement will be made for a real voltage of 0 V, giving a current of 0.707 A,
- the voltage measured is 0 V and the current measured is 0.125 V,
- the fuzzy logic processor deduces, from the membership functions 31 to 34, that the measurement of current belongs at 50.8% to the function 31 and at 49.2% to the function 32 and that the measurement of voltage belongs at 50% to the function 33 and at 50% to the function 34, the decision is equal to $(Pmax*0.508*0.5) -$ $(Pmax*0.492*0.5) - (Pmax*0.508*0.5) + (Pmax*0.492*0.5) = 0.$ The instantaneous power thus measured is added to the accumulated result. It can be verified that, over a period, the error arises especially out of the rounding-off operations performed during the computation.

In the fuzzy logic processor 17, the error actually depends on three parameters:

the current and the voltage are not sampled at the same time for there is only one analog/digital converter available; in fact, there is a shift of some ns, which corresponds to an error of less than 3 per 10,000 per ns of divergence, the errors relating to the rounding-off operations of the processor 18: for a 16-bit computation unit, this corresponds to less than 1 per 10,000, the errors due to the resolution of the analog/digital converter; since this error is fixed, it is the error that determines the precision of the meter.

Thus, in the exemplary embodiment of the present document, there is a scale of voltage that extends over 700 V and a scale of current that extends over 90 A. Low-precision probes with a tolerance of 10% have been taken. This makes it necessary to provide for a scanning of the inputs from −4.5 V to +4.5 V instead of a scanning from −5 V to +5 V at the inputs. Nevertheless, since the error could be bilateral on the probes, the scanning could very well be done only between −4 V and +4 V. This therefore gives a 20% loss of resolution. Sampling the inputs on 16 bits gives a resolution, in the example referred to, of 700/(216/0.8)=8.5 mV and 90/(216/0.8)=1.1 mA, namely less than 10 mW per measurement which is added to the above-mentioned errors that depend on the measurement. In the example, the power consumed is 190 W, the fixed error represents less than 1 per 10,000. In adding up all the errors, the measurement made by the meter is accurate to within 0.1% which is highly acceptable. Furthermore, there are 16-bit converters giving a precision of ½ LSB (least significant bit). This divides the resolution in terms of power by four.

Another advantage of the use of a fuzzy logic processor 17 is that the calibration can be done on site. Indeed, the meter is provided with a connector 19. If it is desired to perform a calibration on site, an operator can connect a precision clamp-on ammeter probe to the supply wire 2 at output of the meter in order to have a very precise measurement of current and connect a voltage probe to the input of the meter in order to have a very precise measurement of the voltage. This clamp-on probe and this voltage probe are connected to a measurement pack that is itself connected to the meter 1 by means of the connector 19. A message sent by the measurement pack reports that the meter 1 must work in calibration mode. The fuzzy logic processor 17 will therefore send synchronization signals corresponding to its sampling in current and voltage. The measurement pack uses these synchronization signals in order to perform the sampling itself of the current measurement that it performs. Then, in order to have a representation of the drift, the instantaneous power measured by the pack is subtracted from the instantaneous power measured by the meter. The power drift is actually proportional to the current drift for the drift of the voltage probe 4 is practically non-existent. This power drift is memorized in an internal register of the fuzzy logic processor 17. At each measurement, the fuzzy logic processor will add this information on power drift to the decision taken by the computer. It is also possible to use a membership function that is always equal to "1" to carry out the storage and addition of this power drift. In fact, this drift corresponds to a shifting of the transfer function of the probe 8 with respect to zero (due to the ageing of the amplifier). For greater certainty, the measurement is made a second time to ascertain that the divergence is not greater than the resolution of the meter 1.

With regard to the other analog inputs of the fuzzy logic processor 17, an input of the fuzzy logic processor 17 receives a tariff signal that is modulated in carrier current on a frequency band centered on 175 Hz or 188 Hz. This signal corresponds to the carrier of a 41-bit frame with a duration of 103 seconds where the "ones" are encoded by the presence of the carrier frequency. The fuzzy logic processor 17 has the task of identifying the frame and reacting in terms of the tariff. For this purpose, membership functions are associated to recognize the binary signal. In order to memorize the tariff information, an internal bit is used indicating the counter of the display system 18 that must be used to store the next kilowatt-hour. This bit representing the tariff message is stored in the memory of the computer 29. The sampling is done preferably at 1 kHz (and not at a multiple of the carrier) to avoid having sampling frequencies that might not be synchronized and might therefore overlap.

Another input receives a signal representing a message sent by carrier current at a frequency of 60 kHz. A message of this kind is not yet used at the present time but may serve to send remote-reading commands or commands for tariff changes that are more complicated than those pertaining to off-peak hours and peak hours. The use of a message by power line carrier current at high frequency enables an increase in the bit rate and makes it easier to filter the messages in the carrier current.

The use of power line carrier current to transmit information provides for many possibilities. Those skilled in the art may refer for example to the patent application No. EP-A-0 678 995 or again to the patent application filed in France under number FR 94 15538 or in Europe under number EP 95 470042.3 for further information on the possibilities offered by communications means using power line carrier currents in conjunction with an electricity meter.

Furthermore, certain variants of a meter of this kind may be envisaged. First of all, it is possible to use a display system that uses only one counter, with the incrementation of values being done with a speed that varies according to the prevailing tariff. That is, the decisions taken in the processor are directly weighted by the currently prevailing tariff. This is actually a system where the consumption is expressed in terms of the peak-hour tariff or quite simply in terms of price.

With the above variant of the price display system, it is possible to associate a price sent by the power line carrier current. That is to say that a message by the power line carrier current would directly contain a price-related weighting factor.

In order to prevent misuse, it is always possible to verify certain details of information contained in the processor, especially information on tariff, by means of the connector 19.

In order to reduce the number of components in the meter 1, it is possible to eliminate the circuit 12. Since the function of the circuit 12 is to filter and demodulate signals in power line carrier current form, the fuzzy logic processor would than have to digitally demodulate the signals coming from the voltage probe 4.

The example described relates to an apartment meter of the single-phase type. An extension to a three-phase type meter is very simple. There are two possibilities: the measurement of power on two phases or the measurement of power on three phases. Measurement on two phases has the advantage of using only two current probes and two voltage probes. However, one disadvantage here is a lack of precision in the measurement due to different parameters. These parameters are, for example, the sampling of the four phases which must be simultaneous, the supposed compensation of the phases or again the resolution in voltage, the measurement of which is done between two phases and not between a phase and the neutral line. The advantage of measurement on three phases is that it is possible to deal with each phase separately (one after the other) with a degree of precision identical to that of the above-described example. The disadvantage is that three voltage probes and three current probes are used since the number of probes is multiplied by the number of phases. Whatever the embodiment chosen, it suffices to add the probes and connect them to the fuzzy logic processor by using an analog switch with additional inputs.

The extension of the invention to three-phase electrical meters has the same advantage as the single-phase version described in greater detail. The calibration on the measuring stand will have its duration increased and will consist of the twofold or threefold repetition of the same operations as for a single-phase meter. The recalibration will entail a checking of two or three current probes in the same way as for a single-phase meter.

The use of a three-phase meter using measurement on all three phases is preferable. For, a meter of this kind enables the compensation of the phases to be checked instantaneously. For this purpose, three variables stored in internal registers of the fuzzy logic processor are used. For each phase, these variables will be totalized over a full period, for example on 20 successive measurements, of the instantaneous power. Then a comparison of the variables will provide knowledge of the divergence in power values between the different phases.

It is possible to conceive of a tariff system that is variable as a function of the compensation to encourage customers to use their electrical installations more efficiently. One or more weighting factors may be used and may be modified for example by means of a message by carrier current.

What is claimed is:

1. An electricity meter comprising a first current probe, a first voltage probe and a display unit memorizing its contents, wherein said meter comprises a fuzzy logic processor connected to said first voltage and current probes, and having a fuzzy logic decision-making computer with a non-volatile memory available to store membership functions having predetermined values for upper and lower threshold voltage values that are recorded during a learning stage where a predetermined voltage and current are imposed on voltage and current probes to determine threshold values corresponding to the first voltage and current probes and to store decision rules representing logic decisions to provide a value in function of the membership value associated to each membership function where the membership functions will fix weighting coefficients depending on measured threshold values and the weighting and mean of the decision rules provide an instantaneous measured power, and wherein said computer takes a decision according to said rules that is weighted by the membership functions and is aimed at incrementing the contents of the display unit to represent an accumulation of the instantaneous measured power.

2. A meter according to claim 1, wherein the fuzzy logic processor comprises an analog switch and an analog/digital converter.

3. A meter according to claim 1, wherein the meter possesses a calibration input formed as a connector to receive a measurement signal from a measurement pack representing a power value measured by the meter, and wherein said connector is connected to the fuzzy logic processor.

4. A meter according to claim 1 wherein the fuzzy logic processor recreates an information element modulated in carrier current from the signals coming from the first voltage and current probes.

5. A method for the recalibration of a meter of a type comprising a first current probe, a first voltage probe, a display and memory unit, a fuzzy logic processor comprising a fuzzy logic decision-making computer, wherein the first voltage probe and first current probe are connected to the fuzzy logic processor, said fuzzy logic decision-making computer comprising a memory for storing membership functions having predetermined values for upper and lower threshold voltage values that are recorded during a learning stage where a predetermined voltage and current are imposed on voltage and current probes to determine threshold values corresponding to the first voltage probe and first current probe and for storing decision rules, where the membership functions will fix weighting coefficients depending on measured threshold values, said fuzzy logic decision-making computer comprising means for taking a decision according to the decision rules representing logic decisions to provide a value in function of the membership value associated to each membership function, and which is weighted by the membership functions for incrementing the contents of the display and memory unit, such that the weighting and mean of the decision rules provide an instantaneous measured power and the display unit represents an accumulation of the instantaneous measured power and a calibration input connector and comprising the step of receiving a measurement signal from a measurement pack representing a measured power value for calibration, wherein the measurement pack comprises a current calibration probe and a voltage calibration probe connected to the calibration input connector of the meter.

6. A method according to claim 5, and further comprising the steps of:
   connecting the voltage calibration probe to the first voltage probe of a calibration input connector,
   connecting the current calibration probe to the calibration input connector,
   exchanging a message signal regarding synchronization between the measurement pack and the meter through the calibration input connector,
   measuring the instantaneous power by the meter and by the measurement pack at one and the same point in time;
   subtracting the instantaneous power values measured by the meter and by the measurement pack to obtain information on a drift in the power, and
   recording in the fuzzy logic processor of the meter the information on the drift in the power.

7. An electricity meter comprising:
   a first current probe;
   a first voltage probe;
   a display and memory unit; and
   a fuzzy logic processor connected to the first voltage and current probes, and comprising a fuzzy logic decision-making computer, said fuzzy logic decision-making computer comprising a memory for storing membership functions having predetermined values for upper and lower threshold voltage values that are recorded during a learning stage where a predetermine voltage and current are imposed on voltage and current probes to determine threshold values corresponding to the first voltage probe and first current probe and for storing decision rules representing logic decisions to provide a value in function of the membership value associated to each membership function where the membership functions will fix weighting coefficients depending on measured threshold values and the weighting and mean of the decision rules provide an instantaneous measured power, said fuzzy logic decision-making computer comprising means for taking a decision according to the decision rules that are weighted by the membership functions for incrementing the contents of the display and memory unit, such that the display unit represents an accumulation of the instantaneous measured power.

8. A meter according to claim 7, wherein said fuzzy logic processor further comprises:
   an analog-to-digital converter connected to said fuzzy logic decision-making computer; and
   an analog switch connected to said analog-to-digital converter.

9. A meter according to claim 7, further comprising a calibration input connector connected to said fuzzy logic processor for receiving a measurement signal from a measurement pack representing a measured power value.

10. A meter according to claim 7, further comprising means for demodulating a current carrier signal from a power line; and wherein said fuzzy logic processor further comprises at least one information input means for receiving the demodulated signal from the current carrier signal for identification by said fuzzy logic decision making computer and for storing in said memory thereof.

11. A meter according to claim 7, wherein said fuzzy logic processor receiving a tariff signal that is modulated on a carrier current on a preselected frequency band.

12. A meter according to claim 7 wherein said memory is a non-volatile memory.

13. An electricity meter comprising:
   a first current probe;
   a first voltage probe;
   a display and memory unit;
   a demodulating circuit for demodulating a current carrier signal from a power line; and
   a fuzzy logic processor connected to each of the first current probe, second current probe and display and memory unit and comprising a fuzzy logic decision-making computer, said fuzzy logic decision-making computer comprising a non-volatile memory for storing membership functions having predetermined values for upper and lower threshold voltage values that are recorded during a learning stage where a predetermined voltage and current are imposed on first voltage and current probes to determine threshold values corresponding to the first voltage probe and first current probe and for storing decision rules representing logic decisions to provide a value in function of the membership value associated to each membership function where the membership functions will fix weighting coefficients depending on measured threshold values, said fuzzy logic decision-making computer comprising means for taking a decision according to the decision rules that are weighted by the membership functions for incrementing the contents of the display and memory unit, such that the weighting and means of the decision rules provide an instantaneous measured power and the display unit represents an accumulation of the instantaneous measured power, and at least one information input means for receiving the demodulated signal from the current carrier signal for identification by said fuzzy logic decision making computer and for storing in said non-volatile memory thereof.

14. A meter according to claim 13, wherein said fuzzy logic processor further comprises:

an analog-to-digital converter connected to said fuzzy logic decision-making computer; and an analog switch connected to said analog-to-digital converter.

15. A meter according to claim 13, further comprising a calibration input connector connected to said fuzzy logic processor for receiving a measurement signal from a measurement pack representing a measured power value.

16. A meter according to claim 13, wherein said fuzzy logic processor receives a tariff signal that is modulated on carrier current on a preselected frequency band.

17. A method for calibrating a meter of a type comprising a first current probe, a first voltage probe, a display and memory unit, a fuzzy logic processor connected to the first current probe and first voltage probe comprising a fuzzy logic decision-making computer, said fuzzy logic decision-making computer comprising a memory for storing membership functions having predetermined values for upper and lower threshold voltage values that are recorded during a learning stage where a predetermined voltage and current are imposed on voltage and current probes to determine threshold values corresponding to the first voltage probe and first current probe and for storing decision rules representing logic decisions to provide a value in function of the membership value associated to each membership function, wherein the membership functions will fix weighting coefficients depending on measured threshold values and the weighting and mean of the decision rules provide an instantaneous measured power, said fuzzy logic decision-making computer comprising means for taking a decision according to the decision rules that is weighted by the membership functions for incrementing the contents of the display and memory unit, such that the display unit represents an accumulation of the instantaneous measured power, and a calibration input connector for receiving a measurement signal representing a measured power value; the method comprising the steps of:

installing the meter at a site; and calibrating the meter at the site by connecting a measurement pack to the calibration input connector of the meter, the pack comprising a current calibration probe and a voltage calibration probe for generating the measured power value.

18. A method according to claim 17, further comprising the steps of:

connecting the voltage calibration probe to the first voltage probe;

connecting the current calibration probe to a same wire as the first current probe;

exchanging an information element of synchronization between the pack and the meter using the calibration input means;

simultaneously measuring instantaneous power by the meter and by the pack;

subtracting the instantaneous power measured by the meter and by the pack to obtain information on a drift in the power; and recording in the fuzzy logic processor of the meter the information on the drift in the power.

* * * * *